United States Patent [19]
Di Pietro

[11] Patent Number: 5,339,739
[45] Date of Patent: Aug. 23, 1994

[54] EMULSION COATING APPARATUS

[76] Inventor: Charles Di Pietro, 503 S. Van Buren St., Batavia, Ill. 60510

[21] Appl. No.: 25,868

[22] Filed: Mar. 3, 1993

[51] Int. Cl.⁵ .............................................. B41M 1/12
[52] U.S. Cl. .................................. 101/129; 101/123; 118/413
[58] Field of Search ............... 101/128.21, 128.4, 123, 101/129; 118/696, 404, 405, 406, 407, 412, 413; 427/272, 282

[56]  References Cited
U.S. PATENT DOCUMENTS 4,363,289  12/1982  Gasser .............................. 101/128.4
4,893,556  1/1990  Takahashi et al. .................. 101/123

Primary Examiner—Edgar S. Burr
Assistant Examiner—Ren Yan
Attorney, Agent, or Firm—Kajane McManus

[57]  ABSTRACT

The stencil emulsion coating apparatus of the present invention includes a screen frame holder and cooperating troughs which coat opposite sides of the screen by running upwardly there against. All motion is provided mechanically without use of hydraulics or pneumatics, with the required motions being electronically controlled in known manner. Each end of each trough is provided with a warpage sensor which senses pressure between the screen and leading trough edge and adjusts trough position in areas of warpage to accommodate same.

2 Claims, 2 Drawing Sheets

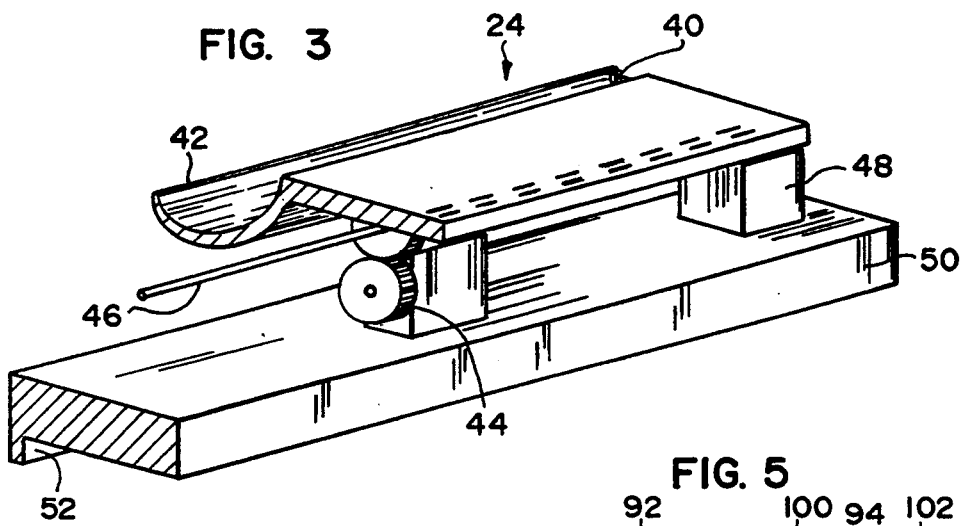
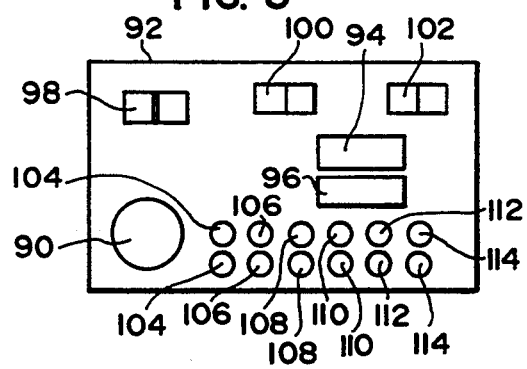
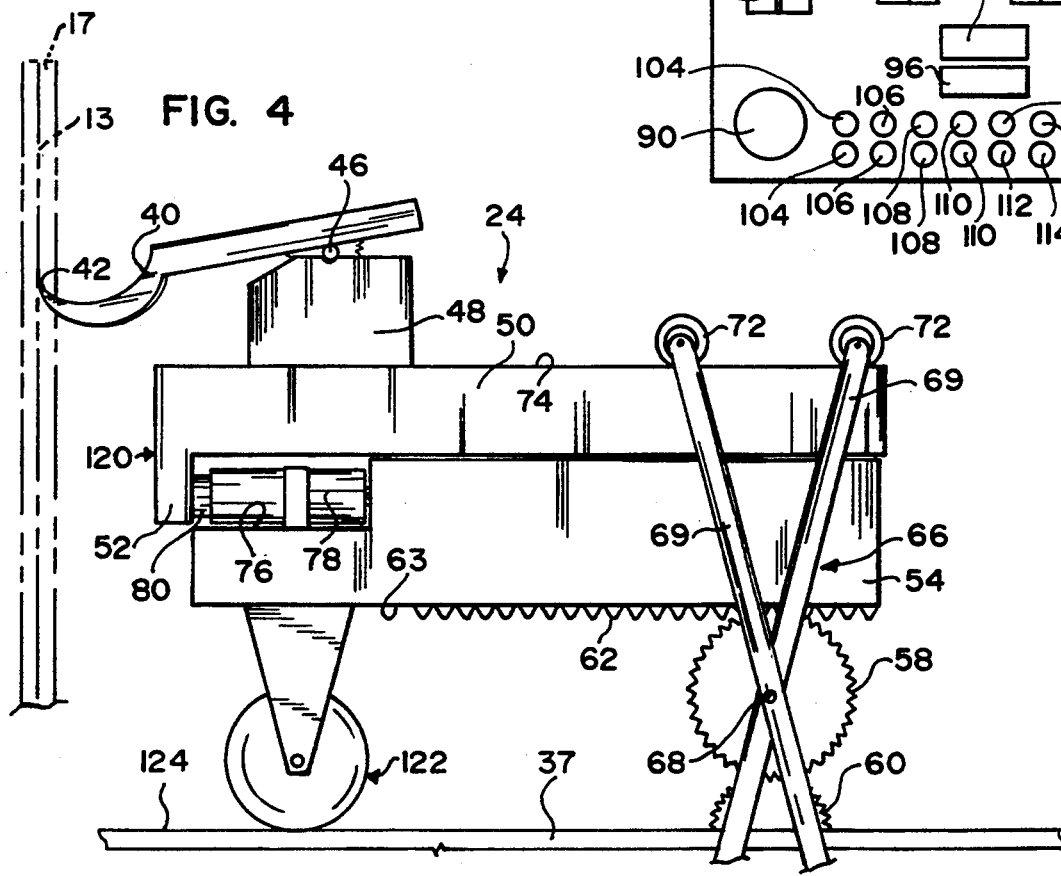

EMULSION COATING APPARATUS

BACKGROUND OF THE INVENTION

1. Field of the Invention

The present invention relates to a silk screen frame emulsion coating apparatus. More particularly the apparatus is completely electro-mechanical requiring no hydraulics or pneumatics and further includes a sensor system for detecting warpage in a screen and adjusting trough position to accommodate the warpage.

2. Description of the Prior Art

Heretofore various emulsion coating apparatus have been proposed. They range from manual to highly sophisticated. Examples are disclosed in the following U.S. Patents:

| U.S. Pat. No. | Patentee |
| --- | --- |
| 4,363,289 | Gasser |
| 4,599,249 | Shirataki |
| 4,668,329 | Shirataki |
| 5,093,160 | Johnson et al. |

All the prior art apparatus include hydraulics for use in moving movable elements of the apparatus. Such hydraulics make the apparatus sensitive to ambient conditions, creating a drawback in the necessity of an appropriate environment.

Further, none of the prior art can accommodate for warpage in a screen to be coated. Such warpage is commonly encountered and inherently decreases the quality of a coating applied to the warped area.

The stencil emulsion coating directly influences image reproduction quality of the resulting silk screen print.

As will be described in greater detail hereinafter, the apparatus of the present invention is entirely electro-mechanical and does not utilize hydraulics or pneumatics. This makes the apparatus very reliable and allows the apparatus to be worked in environments unsuitable for hydraulic/pneumatics actuators. Further, because of mechanical simplicity, the apparatus herein disclosed is much less expensive to manufacture. Also, as will be defined in greater detail hereinafter, a sensing system is provided for detecting areas of screen warpage and accommodating for same providing a significantly increased percentage of useable screens, saving time and labor.

SUMMARY OF THE INVENTION

Accordingly, it is a primary object of the stencil emulsion coating apparatus to provide a completely electro-mechanical apparatus.

A further object is to provide an apparatus which is not influenced by the ambient environment.

A still further object is to provide an apparatus which has lower manufacturing costs.

A yet further object is to provide an apparatus with minimized downtime.

A still further object is to provide an apparatus which senses screen warpage and accommodates for same.

A further object is to provide an apparatus which minimizes, if not altogether eliminates, creation of unuseable screens.

These objects and others are met by the apparatus of the present invention which includes a screen frame holder and cooperating troughs which coat opposite sides of the screen by running upwardly thereagainst. All motion is provided mechanically without use of hydraulics/pneumatics, with the required motions being electronically controlled in known manner. Each end of each trough is provided with a warpage sensor which senses pressure between the screen and leading trough edge and adjusts trough position in areas of warpage to accommodate same as will be described hereinafter.

BRIEF DESCRIPTION OF THE DRAWINGS

FIG. 3 is an enlarged view of a trough tilt mechanism of the apparatus.

FIG. 4 is an enlarged sectional view of one of the trough assemblies including the sensor.

FIG. 5 is a perspective view of a control panel for the apparatus.

DESCRIPTION OF THE PREFERRED EMBODIMENT

Figure 2:
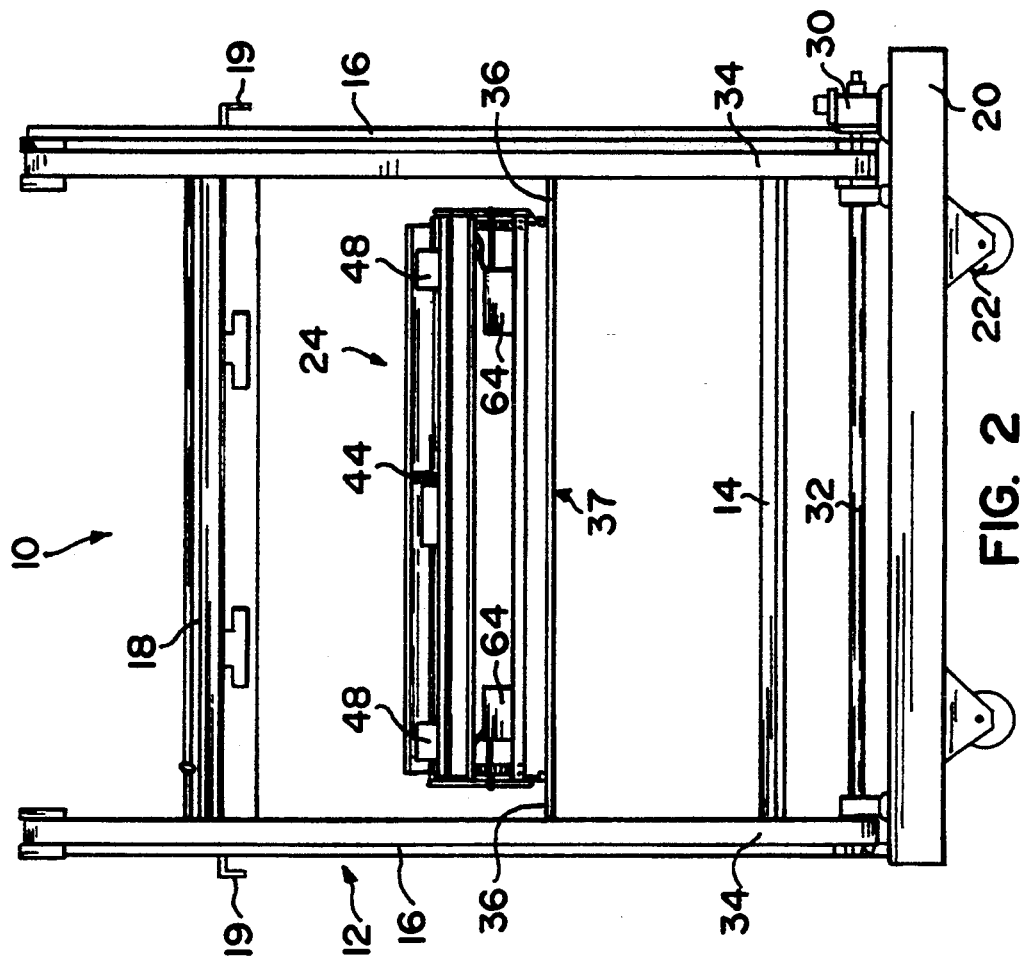
FIG. 2 is a face view of the apparatus of FIG. 1.
Figure 1:
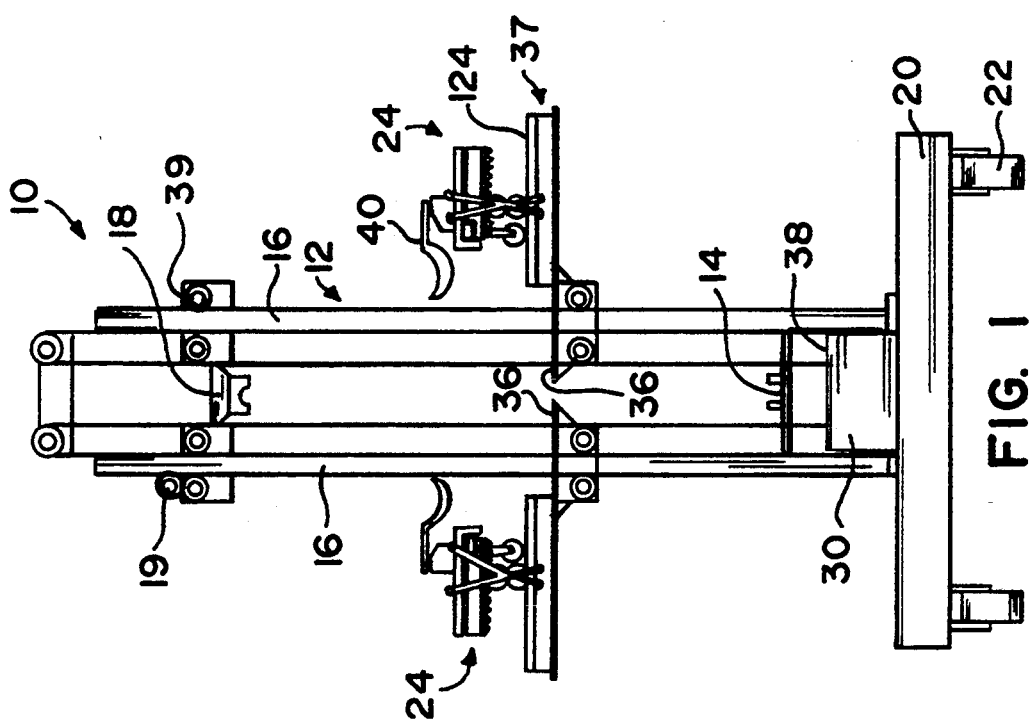
FIG. 1 is a side view of the silk screen apparatus of the present invention.

Referring now to the drawings in greater detail, there is illustrated therein the stencil emulsion coating apparatus of the present invention generally identified by the reference numeral 10.

As shown, the apparatus 10 includes a framework 12 which holds a screen 13 to be coated in a vertical orientation. The framework 12 includes a bottom seat 14, four upright members 16 and a top seat 18, a frame 17 of the screen 13 being locked in place within these confines. The entire framework 12 may be mounted on a base 20 which may include wheels 22 thereon to make the apparatus 10 movable. Position of the top seat 18 may be changed by actuating creak handles 19 to accommodate screens 13 of various size.

To each side of the framework 12 is provided a trough assembly 24 which is used to coat flat surfaces 26 and 28 of the screen 13 with an emulsion (not shown).

Inasmuch as the screen 13 is vertically oriented each trough assembly 24 must be movable vertically along the length of the screen 13. To provide such motion capability, a motor 30 is provided on the base 20, the motor 30 having two gears (not shown) rotationally mounted thereto. Each gear engages a lateral drive timing belt 34 to which ends 36 of a base plate 37 of the trough assembly 24 may be suitably engaged, the belt 34 causing vertical motion of the trough assemblies 24 between lower stop members 38 and upper stop members 39CD provided on each upright member 16. Since the trough assemblies 24 must be capable of returning to a bottom most position thereof, the motor 30 is reversible. Further, it is to be understood that the two gears are moved synchronously by the motor 30 through a single driven shaft 32 for coordinated motion of the opposed trough assemblies 24.

Turning now to a study of the trough assemblies 24, it will first of all be appreciated that each assembly 24 has a trough 40 which is spoon shaped in cross section. Each trough 40 includes a leading edge 42 which engages against the screen 13 and over which emulsion pours off onto the screen 13. Each trough 40 is tippable toward and into the screen 13 for the pour, such tipping being produced by a motorized gear 44 which is centered below the trough 40 which engages a geared shaft 46 upon which the trough 40 is mounted. Such shafted mounting ensures that the trough 40 leading edge 42 is at all times maintained linear, with ends of the shaft 46 being supported in a support block 48 mounted at each end of the trough 40.

The above described trough 40 and tilt mechanism are mounted on a horizontal base plate 50 have a depending forward lip 52. It will be seen that the leading edge 42 of the trough 40 extends beyond the forward lip 52 so that a clearance is provided between the base plate 50 and the screen 13.

This base plate 50 is floatingly supported on a horizontal movable base 54 which seats over the support bracket 37. Between the base 54 and the support bracket 37 at each end thereof is a toothed gear 58 which rests on a free spinning gear 60 which rests within the bracket 37. Wove the toothed gear 58 is a toothed rack 62 which depends from a bottom surface 63 of the base 54. The toothed gear 58 coacts with the toothed rack 62 to incrementally move the base 54 horizontally toward or away from the screen 13. Each toothed gear 58 is driven by a reversible motor 64 (FIG. 2). The motor 64 is capable of very small incremental activations to accommodate the small toothed rack 62.

The driven toothed gears 58 are each engaged in fixed position relative to the bracket 37 by an X shaped clip 66 half which extends from a midpoint 68 of the gear 58 to a termination within openings (not shown) in the bracket 37, such openings fixing the relative angle between arms 69 of the X.

A further half of the clip 66 has terminal end rollers 72 thereon and extends from the midpoint 68 of the gear 58 to a termination where the rollers 72 rest on a top surface 74 of the base plate 50, tying the entire trough assembly 24 together.

Turning back to the base plate 50 and base 54 for same, it will be seen that the base 54 has an undercut hollow 76 therein directly behind the depending lip 52 of the base plate 50 extending across the length thereof. Mounted within this hollow 76, at each end thereof, is a sensor 78, such as the transducer 78 shown in the disclosed embodiment.

Each transducer 78 is controllingly connected to the motor 64 engaged to the gear 58 at the corresponding end of the assembly 24. The transducer 78 has an activator 80 which is spring biased toward and into contact with the depending lip 52 on the base plate 50. The transducer 78 each form a warpage sensor 78 for the corresponding end of the trough assembly 24.

In this respect, when a warped area of the screen 13 is presented, a pressure change is incurred between the leading edge 42 of the trough 40 and the screen 13. When the warp is in a direction away from the trough 40, pressure thereagainst decreases. When a decrease in pressure is incurred, pressure transmitted by the lip 52 against the transducer 78 activator 80 decreases as well. Such decrease of pressure causes activation of the motor 64 engaged thereto to cause the corresponding end of the trough 40 to be moved toward the screen 13 until the pressure sensed by the transducer 78 returns to that which was preselected for the particular screen 13 being coated.

Conversely, if the warpage is toward the particular transducer 78, an increased pressure is produced against the activator 80 by the lip 52. Such increase in pressure causes a reverse motor 64 function, backing off the corresponding end of the trough 40.

It will be understood that the incremental motion is very small, with total travel of the actuator 80 being only one quarter inch. It will also be understood that the transducer 78 activates the motor 64 by creating a particular voltage output which is instantaneous and drives the motor 64 instantaneously. Thus areas of warpage are easily accommodated instantaneously.

It is known that different types of screens require a different pressure of the trough 40 there against to fill the screen correctly. Such required pressure, interpreted as a predetermined voltage level, is initially supplied to the various motors of the apparatus 10 by a rheostat 90 mounted on a control panel 92 of the apparatus 10.

It is proposed to allow the apparatus 10 to function automatically or manually in known fashion by activation of push button 94 or 96 respectively. Also, the control panel should have a power supply switch 98 and settable counters 100 and 102 to dial in a number of desired coats for each surface of the screen 13.

When operated in the manual mode, six push buttons are proposed to be provided for control of operation of each trough 40 with button 104 bringing the trough assembly 24 toward the screen, button 106 moving the trough assembly 24 away, button 108 tilting the trough 40 into the screen 13, button 110 returning the trough 40 to a horizontal position, button 112 moving the trough assembly 24 up and button 114 moving the trough assembly 24 down. Thus, only one trough 40 may be functional at a time. Such control and controllers are known in the art and are only included to give an overview of capabilities of the apparatus 10.

It will be understood that the plate 50, the base 54, and the trough assembly 24 create a downward drift by their weight and action to a leading edge 120 of the assembly 24. To accommodate for this drift, a support structure 122, herein the form of a wheel 122, is depending engaged to a forward end of the underside 63 of the base 54, maintaining the base 54 horizontal and traveling with the base 54, and resting against and rolling upon an upper surface 124 of the bracket 37.

As described above, the apparatus 10 has a number of advantages, some of which have been described above and others of which are inherent in the invention. Also, modifications may be proposed to the apparatus 10 without departing from the teachings herein. Accordingly, the scope of the invention is only to be limited as necessitated by the accompanying claims.

I claim:

1. A screen printing stencil emulsion coating apparatus comprising:
    means for holding a framed screen therein in a vertical orientation;
    means for bringing a tiltable trough containing a coating emulsion against each side surface of the screen at a lower edge thereof;
    means for tilting a leading screen engaging end edge of each trough toward the screen;
    means for setting a desired pressure between the screen and the trough leading edge;
    means for moving the troughs upwardly along the screen;
    means for continuously sensing pressure between the leading edge of each trough and the screen; and
    means for continuously moving each trough horizontally in response to pressure sensed to maintain the desired pressure.

2. A method for electromechanically applying a coating to a screen using an apparatus having no pneumatic or hydraulic components, the method including the steps of:

mechanically holding the screen in a vertical orientation;

mechanically bringing a tiltable trough containing a coating emulsion against each side surface of the screen at a lower edge thereof;

mechanically tilting a leading screen engaging end edge of each trough toward the screen;

mechanically setting the troughs relative to the screen to provide desired pressure therebetween;

mechanically moving the troughs upwardly along the screen;

mechanically and continuously sensing pressure between the leading edge of each trough and the screen; and mechanically and continuously moving each trough horizontally in response to sensed pressure to maintain desired pressure.

* * * * *